United States Patent [19]

Requejo et al.

[11] Patent Number: 4,983,317
[45] Date of Patent: Jan. 8, 1991

[54] ALL PURPOSE CLEANER CONCENTRATE COMPOSITION

[75] Inventors: Luz P. Requejo; George B. Keyes, both of Cincinnati, Ohio

[73] Assignee: The Drackett Company, Cincinnati, Ohio

[21] Appl. No.: 179,083

[22] Filed: Apr. 8, 1988

Related U.S. Application Data

[63] Continuation of Ser. No. 850,636, Apr. 11, 1986, abandoned, which is a continuation of Ser. No. 618,618, Jun. 8, 1984, abandoned.

[51] Int. Cl.$^5$ .............................................. C11D 3/37
[52] U.S. Cl. .......................... 252/174.24; 252/174.23; 252/174.22; 252/139; 252/531; 252/539; 252/DIG. 1; 252/DIG. 2; 252/DIG. 14
[58] Field of Search .................... 252/174.23, 135, 136, 252/174.24, DIG. 2, DIG. 14, 162, 174.22, DIG. 1, 539, 139, 531

[56] References Cited

U.S. PATENT DOCUMENTS

| | | |
|---|---|---|
| Re. 29,337 | 5/1973 | Ward .............................. 252/174.12 |
| 3,031,409 | 4/1962 | Perlman et al. ..................... 252/158 |
| 3,294,693 | 12/1966 | Dupre et al. ....................... 252/135 |
| 3,308,067 | 3/1967 | Diehl .............................. 252/161 |
| 3,342,740 | 9/1967 | Kazmierczak et al. ................ 252/153 |
| 3,453,144 | 7/1969 | Morgan et al. ....................... 134/26 |
| 3,463,735 | 8/1969 | Stonebraker et al. ............... 252/525 |
| 3,579,455 | 5/1971 | Sabatelli et al. .................... 252/135 |
| 3,591,510 | 7/1971 | Zenk ................................ 252/137 |
| 3,686,145 | 8/1972 | Haschke et al. ................... 260/67 U |
| 3,706,672 | 12/1972 | Martin et al. ...................... 252/156 |
| 3,709,825 | 1/1973 | Chirash et al. ..................... 252/158 |
| 3,719,647 | 3/1973 | Hardy et al. ...................... 260/86.1 R |
| 3,734,859 | 5/1973 | Ward ............................... 252/174.12 |
| 3,769,223 | 10/1973 | Pearson et al. ....................... 252/89 |
| 3,825,498 | 7/1974 | Altenschopfer et al. ............... 252/99 |
| 3,882,038 | 5/1975 | Clayton et al. ..................... 252/164 |
| 3,887,497 | 6/1975 | Ulvild ............................. 252/526 |
| 3,922,230 | 11/1975 | Lamberti et al. ..................... 252/89 |
| 3,929,680 | 12/1975 | Arai et al. ........................ 252/542 |
| 3,939,090 | 2/1976 | Zmoda .............................. 252/90 |
| 3,940,356 | 2/1976 | Byrnes ........................... 260/29.6 E |
| 3,950,260 | 4/1976 | Eldib ............................ 252/89 R |
| 3,956,161 | 5/1976 | Woodward ......................... 252/156 |
| 3,966,628 | 6/1976 | Woodward ......................... 252/135 |
| 3,969,500 | 7/1976 | Kennerly ........................... 424/10 |
| 4,021,376 | 5/1977 | Lamberti et al. ................... 252/542 |
| 4,081,395 | 3/1978 | Talley ............................ 252/106 |
| 4,086,178 | 4/1978 | Walker ............................ 252/143 |
| 4,152,305 | 5/1979 | Berghausen, III .................. 252/523 |
| 4,175,062 | 11/1979 | Disch et al. ...................... 252/540 |
| 4,204,052 | 5/1980 | Crutchfield et al. ................ 525/398 |
| 4,213,873 | 7/1980 | Church ........................... 252/174.21 |
| 4,302,348 | 11/1981 | Requejo .......................... 252/135 |
| 4,443,355 | 4/1984 | Muruta et al. .................... 252/174.12 |
| 4,606,842 | 8/1986 | Keyes et al. ..................... 252/174.23 |

FOREIGN PATENT DOCUMENTS

| | | |
|---|---|---|
| 0066342 | 12/1982 | European Pat. Off. . |
| 451342 | of 1936 | United Kingdom . |
| 1350275 | 4/1974 | United Kingdom . |
| 1542027 | 3/1979 | United Kingdom . |

OTHER PUBLICATIONS

Tech. Bull., "Westvaco H-240 Surfactant-Hydrotrope", Westvaco Chemical Division (Oct., 1983).
Tech. Bull., "Westvaco Diacid 1550 Dicarboxylic Acid," Westvaco Chem. Div. (Sep. 1984).
Tech. Bull., "Diacid Surfactants," Westvaco Chemical Division.
Tech. Bull., "Custofac H-240 Surfactant," Westvaco Chemical Division (Aug. 1976).
Tech. Bull., "Colloid 119/50 Antiscalant," Colloids, Inc. (May 1979).
Tech. Bull., "Colloid 117," Colloids, Inc. (Apr. 1978).
Tech. Bull., "Polymeric Additives for Aqueous Systems," Rohm and Haas Industrial Chemicals (Dec. 1981).

Primary Examiner—Paul Lieberman
Assistant Examiner—John F. McNally
Attorney, Agent, or Firm—Charles J. Zeller

[57] ABSTRACT

A general purpose hard surface cleaner concentrate comprising an organic solvent system comprising from about 1 to about 10% of an organic solvent selected from the group of alkylene and polyalkylene glycols and lower alkyl ethers of alkylene and polyalkylene glycols; from about 3 to 15% of a nonionic or anionic surfactant; from about 1 to about 10% of a builder system comprising 25 to 99% of a first builder and from about 5 to 65% of a second builder which is a polyacrylic resin having a molecular weight between about 500 to about 8,000; from about 1 to about 15% of a hydrotrope which is an alkali metal salt of a cyclohexene dicarboxylic acid, and water. The preferred hydrotrope is the potassium salt of 5 (or 6) carboxy-4-hexyl-2-cyclohexene-1-octanoic acid. In use the concentrate is diluted to a ratio of 10 to 150 parts water per part of the concentrate, although is useful full strength as a spot cleaner.

24 Claims, No Drawings

ALL PURPOSE CLEANER CONCENTRATE COMPOSITION

This is a continuing application of application Ser. No 850,646 filed Apr. 11, 1986 which is a continuing application of Ser. No. 618,618 filed June 8, 1984.

FIELD OF INVENTION

This invention relates to liquid compositions for cleaning a wide variety of hard surfaces, particularly metallic, plastic, tile, porcelain, glass and mirrored surfaces. More specifically, this invention relates to a hard surface cleaner concentrate which is to be diluted with water prior to use, although use at full strength is contemplated for particularly difficult cleaning problems. Most specifically, the cleaning compositions herein disclosed contain a polyacrylic acid or a polyacrylate resin builder in combination with a hydrotrope which is an alkali metal salt of a $C_{21}$ dicarboxylic acid.

BACKGROUND OF INVENTION

General purpose cleaners should be suitable for use on a wide variety of surfaces and effective against different types of soil deposits, e.g. grease, heel scuff marks, food spills, dirt buildup, wax buildup, mildew, and the like. Preferably, the cleaner should not exhibit a high degree of sudsing so as to minimize streaking when used on highly polished surfaces, for example, glass surfaces, bathroom tiles, marble and terrazzo floors, and counter tops. Cleaners in concentrate form are particularly advantageous because the degree of dilution can be regulated depending upon the nature of the surface to be cleaned and the type of soil to be removed. In addition, concentrates are cost effective from the standpoint of shipping and warehousing. Finally, concentrates, when used full strength for spot cleaning, are effective for removing extremely difficult to remove soils and stains.

Many cleaning concentrates are commercially available such as CLEAN QUICK sold by Procter & Gamble Company, FORWARD sold by S. C. Johnson & Co., Inc., and SOILAX sold by Economics Laboratories, Inc. Many cleaning compositions, whether for glass surfaces or for general purpose cleaning, have also been identified by the patent literature. For example, glass cleaning compositions are disclosed in U.S. Pat. No. 3,463,735 to Stonebraker et al; 4,213,873 to Church; 4,086,178 to Walker; and 4,081,395 to Talley.

All purpose hard surface cleaning compositions are described in U.S. Pat. Nos. 3,453,144 to Morgan; 3,882,038 to Clayton et al; 3,709,825 to Chirash et al; 3,923,678 to Kleiner et al; 4,302,348 to Requejo; 4,152,305 to Berghausen, III; U.S. Pat. Nos. 3,956,161 and 3,966,628 to Woodward, U.S. Pat. Nos. 4,175,062 to Disch et al; 3,887,497 to Ulvild; 3,239,467 to Lipinski; 3,210,287 to Kelly et al, and 3,591,510 to Zenk.

Common to each of the above captioned commercial products or patented formulations is the incorporation of a surface active agent, typically an anionic or nonionic surfactant; an organic solvent, typically a low molecular weight alcohol, a low molecular weight ether, a glycol ether, or mixture thereof; and water. In many of these formulations, a phosphate builder is incorporated as well as an alkali metal salt of an alkylaryl sulfonate used as a hydrotrope coupler. Other constituents may include pH control agents, pH adjusting agents, chelating agents, germicides, a fluorocarbon surfactant, and a corrosion inhibitor.

SUMMARY OF INVENTION

It is an object of the present invention to provide an all purpose cleaner concentrate suitable for use on a wide variety of hard surfaces and effective, depending upon the degree of dilution, on many cleaning problems.

It is a further object of this invention to provide a hard surface cleaner concentrate that has a low foaming tendency so that it does not leave a residue which results in streaking and smearing of the cleaned surface.

It is another object of this invention to provide a hard surface cleaner concentrate that may be formulated without phosphate builders, which are not preferred in view of environmental considerations.

An primary object of the present invention is to provide a cleaner concentrate that has superior cleaning efficacy by incorporating a polyacrylic acid or polyacrylate resin builder and a cyclohexene dicarboxylic acid hydrotrope.

These and other objects, advantages, and benefits of the present invention are discernable from a reading of the detailed description of the invention, a summary of which appears below.

The cleaner composition concentrate comprises on a weight basis:
  (a) from about 1 to about 10% of an organic solvent;
  (b) from about 3 to about 15% of a nonionic or anionic surfactant;
  (c) from about 1 to about 10% of a builder system comprising:
    (i) from about 25 to 99% of a first builder, and
    (ii) from about 5% to about 65% of a second builder which is a polyacrylic resin or soluble salt thereof, said second builder having a molecular weight from about 500 to about 8,000;
  (d) from about 1 to about 15% of a hydrotrope which is an alkali metal salt of a cyclohexene dicarboxylic acid, the weight ratio of said hydrotrope to said second builder being in the range of from 1:1 to about 20:1, and
  (e) water.

Preferably, the surfactant is a water soluble primary alcohol ethoxylate having from 6 to 15 moles ethylene oxide and 9 to 13 carbon atoms in the alcohol moiety or a water soluble alkylphenoxy polyethoxy ethanol having 8 to 16 moles of ethylene oxide, the alkyl group having from about 6 to about 12 carbon atoms. The first builder preferably is selected from the group consisting of alkali metal carbonate, bicarbonate, sesquicarbonate and sulfate salts. The hydrotrope is preferably the potassium salt of 5 (or 6) carboxy-4-hexyl-2-cyclohexene-1-octanoic acid. Optionally, the cleaner concentrate formulation can also include a chelating agent, an alkalinity agent, a perfume, and a dye.

The organic solvent may be selected from the group consisting of alkylene and polyalkylene glycols of from 2 to about 6 carbon atoms and lower alkyl ethers of alkylene and polyalkylene glycols of from 3 to 8 carbon atoms, the alkyl ether moiety having from 1 to 4 carbon atoms, said organic solvent having a boiling point of from about 120° C. to about 250° C. The organic solvent may comprise a mixture of two or more solvent constituents. A lower aliphatic alcohol of from 2 to 4 carbon atoms may also be included in the composition to adjust evaporation rate of the composition.

The cleaner concentrate is prepared for use by diluting the concentrate with from about 10 to about 150 parts of water per part concentrate, preferably with 20 to 100 parts of water per part concentrate However, for heavy grease, oil, or heel marks, the concentrate can be used full strength.

DETAILED DESCRIPTION OF INVENTION

In accordance with the present invention, it has been found that an effective general purpose cleaner concentrate can be obtained by the combination of a polyacrylic acid or alkali metal salt of a polyacrylic acid as a builder and a cyclohexene dicarboxylic acid or salt thereof as a hydrotrope, incorporated into a composition further comprising an organic solvent; a nonionic or anionic surfactant, and another builder. It has further been found that the polyacrylic builder-hydrotrope system incorporated therein is effective on many types of hard surfaces without causing streaking or smearing.

The organic solvent comprises from about 1 to about 10% by weight of the composition. If less then about 1% is employed, this ingredient will not impart its desired effect, i.e., the increase in lubricity or ease with which the composition may be spread on a surface; while using more than about 10% may have a deleterious effect on the polyacrylic builder. The solvent may comprise a mixture of two or more solvents.

The solvent may be selected from the group consisting of alkylene and polyalkylene glycols of from 2 to 6 carbon atoms, and lower alkyl ethers of alkylene and polyalkylene glycols of from 3 to 8 carbon atoms, the solvent having a boiling point of from about 120° to about 250° C. With respect to the lower alkyl glycol ethers, the alkyl ether moiety has from 1 to 4 carbon atoms. Examples of these compounds which are suitable are ethylene glycol, propylene glycol, trimethylene glycol, 1,2-butanediol, 1,3-butanediol, tetramethylene glycol, 1,2-pentanediol, 1,4-pentanediol, pentanemethylene glycol, 2,3-hexanediol, hexamethylene glycol, propylene glycol monopropylether, propylene glycol monobutylether, propylene glycol monoethylether, ethylene glycol monobutylether, diethylene glycol monoethyl ether, and mixtures thereof. A particularly suitable compound for use herein is ethylene glycol monobutylether which has a boiling point of about 171° C.

A particularly preferred amount of the organic solvent for use herein is between about 2.5 to about 6.0% by weight.

Up to about 5% by weight of the composition of a lower aliphatic alcohol can be included as a constituent of the compositions of the present invention to adjust evaporation rate and as a preservative. The lower aliphatic alcohols which are suitable are those having from 2 to about 4 carbon atoms and having a boiling point within the range of from about 75° to about 100° C. Examples of these are isopropyl alcohol, n-propyl alcohol, ethyl alcohol, sec-butyl alcohol, tert-butyl alcohol, and mixtures thereof. Lower aliphatic alcohols which do not possess requisite boiling points are not suitable for use herein, in that those having a boiling point below 75° C. tend to evaporate too quickly to provide the desired properties, while those having boiling points in excess of 100° C. tend to evaporate too slowly. A particularly suitable lower aliphatic alcohol is isopropyl alcohol, which has a boiling point of about 82.3° C. An amount of the low molecular weight aliphatic alcohol component particularly suitable for use herein is from about 0 to about 2.5% by weight of the composition.

The surfactant is selected from the group of anionic and nonionic surfactants which are compatible with the organic solvents used herein. The amount of surfactant can vary from about 3 to about 15% by weight. A particularly suitable amount for use herein is from about 6 to about 10% by weight. Examples of surfactants are the linear primary alcohol ethoxylates, such as the reaction product of a linear primary alcohol having from about 7 to about 11 carbon atoms reacted with 2 to about 16 moles of ethylene oxide; the alkyl aryl sulfonates; polyethylene oxide ethers of fatty alcohols; alkali salts of alkyl sulfates; alkyl phenoxy polyethoxy ethanols, and alkyl lauryl ether sulfate alkali salts. A particularly suitable surfactant is a water soluble nonylphenoxy polyethoxy ethanol containing 9 to 12 moles of ethylene oxide, sold commercially as Triton N-101 or Igepal CO-630.

The builder system is present in an amount of from about 1 to about 10% by weight of the composition, preferably from about 2.5 to about 6.5% by weight. The first builder may be selected from the group consisting of carbonate, silicate, bicarbonate, sesquicarbonate and sulfate alkali metal salts. In addition, alkali metal phosphates, for example tetrasodium pyrophosphate, and carboxymethyloxy succinates may be used as the first builder. The first builder is present in an amount from about 25% to about 99%, preferably in an amount of from about 80% to about 99%, by weight of the builder system, and is used in the formula to increase alkalinity of the concentrate.

The second builder is a polyacrylic alkali or a alkyl metal salt of a polyacrylic acid, said polyacrylic material having a molecular weight of from about 500 to about 8,000. This builder has the general structural formula

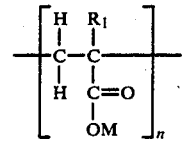

where n is equal to about 10 to about 100, $R_1$ is hydrogen or a methyl or ethyl group, and M is hydrogen, ammonium, or an alkali metal selected from the group consisting of sodium, potassium, or lithium. The polyacrylic builder is present in the builder system in an amount of from about 5 to about 65% by weight on an active basis, preferably from about 10 to 30%. Typically, this second builder is provided in solution form, the solvent being water, and is between about 40 to about 60% active. The polyacrylic builder of the present invention is commercially available as Acrysol LMW from Rohm and Haas Co., Inc.; Colloid 117 from Colloids, Inc.; and Calnox 236 from Aquaness Chemical Company. Preferably, the molecular weight of the polyacrylic builder is from about 1,000 to about 5,000. Because the polyacrylic builder component is not compatible with the organic solvent, these constituents are not admixed together. Preferably, the polyacrylic acid is further diluted with water to form a premix, to which is then added an aqueous solution of the first builder, and then the other constituents to form the composition.

The hydrotrope of the present invention is an alkali metal salt of a cyclohexene carboxylic acid having the structural formula indicated below:

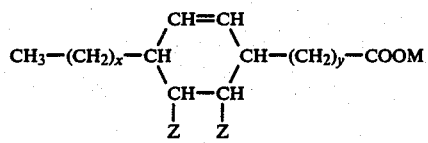

wherein x and integers from 3 y are to 9, x and y together equaling 12, Z is a member of the group consisting of hydrogen and $COOM_1$, with one Z of each moiety, and M and $M_1$ are selected from the group consisting of hydrogen, sodium, potassium, lithium, ammonium, organic amines, and mixtures thereof. These compounds have been disclosed in U.S. Pat. Nos. 3,734,859 and Re 29,337 to Ward, which patents are incorporated herein by reference thereto. This class of compounds is generally referred to as "$C_{21}$ dicarboxylic acids". They are produced from linoleic acid of various animal, vegetable and tall oil sources, and may be made synthetically by reacting linoleic acid with acrylic acid and catalytic amounts of iodine.

The hydrotrope is present in an amount of from about 1 to about 15% by weight of the concentrate, preferably in an amount of from about 2.5 to about 6% by weight. The $C_{21}$ dicarboxylic acids of the present invention are commercially available from Westvaco Corporation and are sold under the trade name Westvaco H-240 surfactant. The weight ratio of the hydrotrope to the polyacrylic builder is from about 1:1 to about 20:1, preferably from about 4:1 to about 12:1. The preferred dicarboxylic acid is the potassium salt of 5 (or 6) carboxy-4-hexyl-2-cyclohexene-1-octanoic acid.

It has been found that this combination of the polyacrylate builder and the dicarboxylic acid in a general purpose cleaner concentrate is quite advantageous, the builder increasing the detersive power of the surfactant, and the hydrotrope assisting in the dissolution of the organic compounds present, when the concentrate is greatly diluted with water.

The concentrate composition of the present invention may also comprise optional constituents as described below. A chelating agent can be included to reduce the effects of hard water on detergent, the chelating agent being present in an amount of from about 0 to about 5% by weight of the concentrate composition, preferably in an amount of from about 1 to about 3% by weight. Chelating agents known in the art can be used, for example, an alkali metal citrate, sodium salt nitrilotriacetic acid, and the instant disclosure is not intended to limit the chelating agent used. Particularly useful is Versene 100, which is the sodium salt of ethylenediaminetetraacetic acid, which is uneffected by extreme conditions of temperature, acidity, or basicity, and which is inert to most chemicals. Another optional constituent is a fugitive alkaline agent included in an amount of from about 0 to about 3% by weight, preferably from about 0 to about 1% by weight. Morpholine and ammonia are preferred fugitive alkaline materials, and improve detergency without increasing the level of nonvolatile constituents. Other optional constituents are perfumes and dyes, which may comprise in combination up to about 3% by weight of the formulation, preferably up to 1% of the formulation.

Although it is preferred not to incorporate a phosphate builder, in view of the detrimental effects phosphates have on the environment, the inclusion of a phosphate builder is not incompatible with the invention disclosed herein. Particularly suitable alkyl metal polyphosphates includable herein are sodium tripolyphosphate, tetrasodium pyrophosphate and sodium hexametaphosphate, preferably in an amount of less then about 2.0% by weight of the composition.

EXAMPLE I

Two compositions were prepared. Composition A was a control containing Triton H-66, an anionic phosphate hydrotrope; Composition B was in accordance with the present invention.

| Component | % by Weight A | % by Weight B |
|---|---|---|
| Triton N-101[1] | 8.0 | 8.0 |
| Sodium carbonate | 4.5 | 4.5 |
| Ethylene glycol monobutyl ether | 3.0 | 3.0 |
| Isopropyl alcohol | 1.0 | 1.0 |
| Westvaco H-240[2] | — | 3.0 |
| Polyacrylic acid[3] | — | 0.25 |
| Versene 100[4] | 3.0 | 3.0 |
| Triton H-66[5] | 4.5 | — |
| Perfume | 0.25 | 0.25 |
| Deionized water | q.s. 100% | q.s. 100% |
| | 100.0 | 100.0 |

[1]Triton N-101 (surfactant); a 100% active water soluble nonylphenoxy polyethoxy ethanol containing 9 to 10 moles ethylene oxide; manufactured by Rohm & Haas Company.
[2]Westvaco H-240 (a C21 dicarboxylic acid) 42% active; potassium salt of 5 (or 6) carboxy-4-hexyl-2-cyclo-hexene-1-octanoic acid; manufactured by Westvaco Corporation.
[3]Polyacrylic acid; 2-propenoic acid; 2-propenoic acid polymer with sodium phosphinate; about 48% active.
[4]Versene 100; an aqueous solution, 38% active, of tetrasodium salt of ethylenediaminetetraacetic acid; manufactured by Dow Chemical Company.
[5]Triton H-66 (hydrotrope); anionic phosphate surfactant, potassium salt - 50% active; manufactured by Rohm & Haas Company.

The Compositions A and B were tested for their ability to remove pencil marks at 1:64 dilution with tap water. First a painted enamel test plate was marked uniformly with Eberhard Faber Ebony Black pencil and then cleaned with 30 cycles of a Gardner Washability Machine, half the plate being cleaned with Composition A and the other half with Composition B. Qualitatively it was observed that the composition of the present invention (Composition B) was 30 to 50% cleaner than the half cleaned with Composition A.

In a second test plates were marked uniformly with Binney and Smith red crayon, and cleaned with 30 cycles of the Gardner Washability Machine using compositions A and B at full strength. No significant difference between the compositions was observed. Three observers were used in these blind evaluations.

EXAMPLE II

Two compositions C and D, were prepared, both in accordance with the present invention:

| Component | % by Weight C | % by Weight D |
|---|---|---|
| Triton N-101 | 8.0 | 8.0 |
| Sodium carbonate | 4.5 | 4.5 |
| Ethylene glycol monobutyl ether | 3.0 | 3.0 |
| Westvaco H-240 | 4.5 | 4.5 |
| Polyacrylic acid | 0.25 | 0.50 |
| Versene 100 | 3.0 | 3.0 |
| Perfume | 0.25 | 0.25 |

-continued

| Component | % by Weight | |
| --- | --- | --- |
| | C | D |
| Dye | 0.25 | 0.25 |
| Deionized water | q.s. 100% | q.s. 100% |
| | 100.0 | 100.0 |

These compositions were compared against one another at full strength and at 1:20 dilution. In both instances the results were comparable.

Composition D was also evaluated against commercial cleaner concentrates as indicated by the test protocol described below.

Five painted enamel test plates were prepared by marking with Blaisdell grease pencil #969T, which plates were aged for one week. Half-plate sections were then cleaned with the cleaners noted below, and with the other cleaners at 1:20 dilution using the Gardner Washability Machine set for 25 cycles and contact time of 30 seconds. Afterwards each plate was rinsed with tap water to remove the residue.

| Plate No. | Cleaner Right | Cleaner Left | Observation |
| --- | --- | --- | --- |
| 1 | FORWARD[1] | Comp. D | Left side was cleaner. No trace of grease soil remained on left side, while right side had a "red painted" (smeared) appearance. |
| 2 | Comp. D | FORWARD | Right side was cleaner. Observations for Plate No. 1 reproduced. |
| 3 | CLEAN QUICK[2] | Comp. D | Left side much cleaner. Soil on right side not dissolved completely. |
| 4 | Comp. D | CLEAN QUICK | Right side much cleaner. Observations for Plate 3 reproduced. |
| 5 | FORWARD | CLEAN QUICK | Left side was cleaner, but difference not as dramatic as for Plates 1 to 4 using Composition D. |
| The above tests were repeated using three newly prepared plates. | | | |
| 6 | FORWARD | Comp. D | Left side cleaned almost completely, while soil on right side hardly touched. |
| 7 | Comp. D | CLEAN QUICK | Right side almost completely cleaned; left side slightly cleaned. |
| 8 | CLEAN QUICK | FORWARD | Neither left nor right side cleaned, but right side slightly cleaner. |

[1] FORWARD ® - manufactured by S. C. Johnson & Son, Inc., and contains an ethoxylated alcohol nonionic surfactant, a silicate, n-alkyldimethylbenzyl ammoium chloride cationic surfactant, and a pyrophosphate. Solvent is isopropyl alcohol and water.
[2] CLEAN QUICK - manufactured by Procter & Gamble, Inc., and containing an alkyl sulfate anionic surfactant, an acryl sulfonate anionic surfactant, a pyrophosphate, a bicarbonate, and water as the solvent.

EXAMPLE III

Composition C was compared against commercial brands using a procedure similar to Example II. Plates 9 to 12 below ere marked with red crayon and subjected to the Gardner Washability Machine for 25 cycles, with plates 9 and 10 being cleaned with the cleaner at full strength, and with plates 11 and 12 being cleaned with the cleaner at 1:20 dilution. Plates 13 to 16 below were marked with black pencil and cleaned with 50 cycles on the Gardner Washability Machine, with the cleaner in each instance at 1:20 dilution.

| Plate No. | Cleaner Right | Cleaner Left | Observation |
| --- | --- | --- | --- |
| 9 | FORWARD | Comp. C | Left side was cleaner than right side of plate. |
| 10 | Comp. C | CLEAN QUICK | Right side was cleaner than left side of plate. |
| 11 | Comp. C (1:20 Dil.) | FORWARD (1:20 Dil.) | No significant difference was observed. |
| 12 | CLEAN QUICK (1:20 Dil.) | FORWARD (1:20 Dil.) | No significant difference was observed. |
| 13 | Comp. C (1:20 Dil.) | CLEAN QUICK (1:20 Dil.) | Right side significantly cleaner |
| 14 | FORWARD | Comp. C | Left side significantly cleaner. |
| 15 | Comp. C | FORWARD | Right side significantly cleaner. |
| 16 | CLEAN QUICK | Comp. C | Left side significantly cleaner. |

We claim:

1. A hard surface cleaner composition concentrate comprising on an active basis by weight of said concentrate from about 1 to about 10% of an organic solvent; from about 3 to 15% of a surfactant selected from the group consisting of nonionics, anionics, and combinations of same; from about 2.5 to about 6.5% of a builder system comprising from about 97.4 to about 94.9% of a first builder, and from about 2.6 to about 5.1% of a second builder that is a polyacrylic acid resin of soluble salt thereof having a molecular weight of from about 500 to about 8,000, said first and second builders being different one from the other; from about 1 to about 6% of a hydrotrope that is an alkali metal salt of a C21 cyclohexene dicarboxylic acid, the weight ratio of said hydrotrope to said second builder being in the range of 1:1 to 20:1, and water.

2. The concentrate cleaner of claim 1 wherein the surfactant is selected from the group consisting of linear primary alcohol ethoxylates; alkyl aryl sulfonates; polyethylene oxide ethers of fatty alcohols; alkyl sulfate alkali metal salts; alkyl phenoxy polyethoxy ethanol, and alkyl ether sulfate alkali metal salts.

3. The cleaner concentrate of claim 2 wherein the surfactant is present in an amount of from about 6 to about 10%.

4. The concentrate cleaner of claim 1 wherein the hydrotrope is an alkali metal salt of 5 (or 6) carboxy-4-hexyl-2-cyclo-hexene-1-octanoic acid.

5. The concentrate cleaner of claim 4 wherein the hydrotrope is present in an amount of from about 2.5 to about 6%.

6. The cleaner concentrate of claim 1 wherein the solvent is selected from the group consisting of alkylene and polyalkylene glycols of from 2 to about 6 carbon atoms and lower alkyl ethers of alkylene and polyalkylene glycol of from 3 to 8 carbon atoms, the alkyl ether moiety having from 1 to 4 carbon atoms, the boiling point of said solvent being from 120° to about 250° C.

7. The concentrate cleaner of claim 6 wherein the first builder is present in an amount of from about 80% to about 99% by weight of the builder system.

8. The concentrate of claim 6 wherein the solvent is ethylene glycol monobutyl ether.

9. The concentrate cleaner of claim 6 wherein the organic solvent is present in an amount of from about 2.5 to about 6%.

10. The concentrate cleaner of claim 9 wherein the organic solvent is ethylene glycol monobutyl ether.

11. The concentrate cleaner of claim 1 wherein the first builder is selected from the group consisting of alkali metal carbonate, bicarbonate, silicate and sulfate salts.

12. The concentrate cleaner of claim 1 further comprising less than about 5% of a lower aliphatic alcohol of from 2 to 4 carbon atoms, said alcohol having a boiling point of from about 75° to about 100° C.

13. The concentrate cleaner of claim 12 wherein the alcohol is isopropyl alcohol.

14. The concentrate cleaner of claim 1 further comprising at least one of the following: a dye, a perfume, a chelating agent, or a fugitive alkaline agent.

15. The concentrate cleaner of claim 14 wherein the dye is present in an amount of less than 1%.

16. The concentrate cleaner of claim 14 wherein the perfume is present in an amount of less than 1%.

17. The concentrate cleaner of claim 14 wherein the chelating agent is selected from the group consisting of potassium citrate, and sodium salt of nitrilotriacetic acid, and is present in an amount of less than about 5%.

18. The concentrate cleaner of claim 14 wherein the fugitive alkaline agent is selected from the group consisting of ammonia and morpholine, and is present in an amount of less than about 3%.

19. The cleaner concentrate of claim 11 wherein the ratio of hydrotrope to second builder is from about 4:1 to about 12:1.

20. The cleaner concentrate of claim 10 diluted by 10 to 150 parts water per part of said composition.

21. The cleaner concentrate of claim 11 diluted by 10 to 150 parts water per part of said composition.

22. A method of cleaning a hard surface comprising the steps of diluting the composition of claim 1, 4 or 5 with water to a ratio between 10 to 150 parts water to one part of said composition; applying said diluted composition to the surface to be cleaned, and wiping said surface with a cloth, towelette, or sponge.

23. A method of cleaning a hard surface comprising the steps of diluting the composition of claim 11 with water to a ratio of between 10 to 150 parts water per part of said composition; applying said diluted composition to the surface to be cleaned, and wiping said surface with a cloth, towelette, or sponge.

24. The concentrate cleaner composition of claim 11 including less than about 5% ethylenediaminetetraacetic acid.

* * * * *